(12) United States Patent
Montmeat et al.

(10) Patent No.: US 10,854,493 B2
(45) Date of Patent: Dec. 1, 2020

(54) METHOD FOR MANUFACTURING A HANDLING DEVICE AND METHOD FOR REVERSIBLE BONDING USING SUCH A DEVICE

(71) Applicant: COMMISSARIAT A L'ENERGIE ATOMIQUE ET AUX ENERGIES ALTERNATIVES, Paris (FR)

(72) Inventors: Pierre Montmeat, Froges (FR); Frank Fournel, Villard-Bonnot (FR)

(73) Assignee: COMMISSARIAT À L'ÉNERGIE ATOMIQUE ET AUX ÉNERGIES ALTERNATIVES, Paris (FR)

( * ) Notice: Subject to any disclaimer, the term of this patent is extended or adjusted under 35 U.S.C. 154(b) by 561 days.

(21) Appl. No.: 15/611,413

(22) Filed: Jun. 1, 2017

(65) Prior Publication Data
US 2017/0352571 A1 Dec. 7, 2017

(30) Foreign Application Priority Data

Jun. 3, 2016 (FR) ..................... 16 55076

(51) Int. Cl.
*H01L 21/683* (2006.01)

(52) U.S. Cl.
CPC .. *H01L 21/6835* (2013.01); *H01L 2221/6834* (2013.01); *H01L 2221/68318* (2013.01);
(Continued)

(58) Field of Classification Search
CPC ......... H01L 21/6835; H01L 2221/6834; H01L 2221/68327; H01L 2221/68381; H01L 2221/68318
See application file for complete search history.

(56) References Cited

U.S. PATENT DOCUMENTS

2011/0230005 A1* 9/2011 Vaufredaz ............. H01L 21/304
438/73
2012/0118511 A1* 5/2012 Imai ....................... B32B 38/10
156/712

(Continued)

FOREIGN PATENT DOCUMENTS

JP 2002203821 A * 7/2002
JP 2009054883 A * 3/2009

OTHER PUBLICATIONS

JP2002203821-A published Jul. 2002 Machine Translation of Description (Google/EPO).*

(Continued)

*Primary Examiner* — Christopher T Schatz
*Assistant Examiner* — Cynthia L Schaller
(74) *Attorney, Agent, or Firm* — Pillsbury Winthrop Shaw Pittman LLP

(57) ABSTRACT

A method for manufacturing a handling device includes depositing a single layer of an adhesive on a first surface of a first wafer; depositing an antiadhesive layer on a first surface of a second wafer different from the first wafer; bringing into contact the first wafer and the second wafer, the bringing into contact taking place at the level of the single adhesive layer of the first wafer and the antiadhesive layer of the second wafer; separating the first wafer and the second wafer; the first wafer including the single adhesive layer forming a handling device. The bringing into contact of the first wafer and the second wafer is carried out at a temperature $T_C$ such that $T_C > T_g + 100°$ C. where $T_g$ is the glass transition temperature of the material composing the single adhesive layer of the first wafer.

6 Claims, 8 Drawing Sheets

(52) U.S. Cl.
CPC .............. *H01L 2221/68327* (2013.01); *H01L 2221/68381* (2013.01)

(56) References Cited

U.S. PATENT DOCUMENTS

| | | |
|---|---|---|
| 2014/0057450 A1 | 2/2014 | Bourbina et al. |
| 2015/0194331 A1 | 7/2015 | Bai et al. |
| 2019/0109034 A1* | 4/2019 | Fehkuhrer ......... H01L 21/67092 |

OTHER PUBLICATIONS

JP2009054883-A published Mar. 2009 Machine Translation of Description (Google/EPO).*
Preliminary Search Report as issued in French Patent Application No. 1655076, dated Jan. 26, 2017.
Wiederhorn, S. M., et al., "Critical Analysis of the Theory of the Double Cantilever Method of Measuring Fracture-Surface Energies," Journal of Applied Physics, vol. 39, No. 3, Feb. 1968, pp. 1569-1572.

* cited by examiner

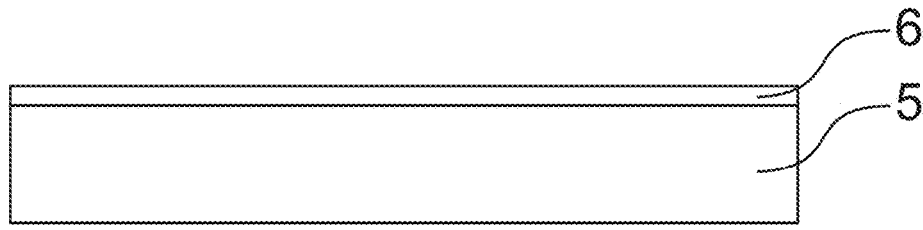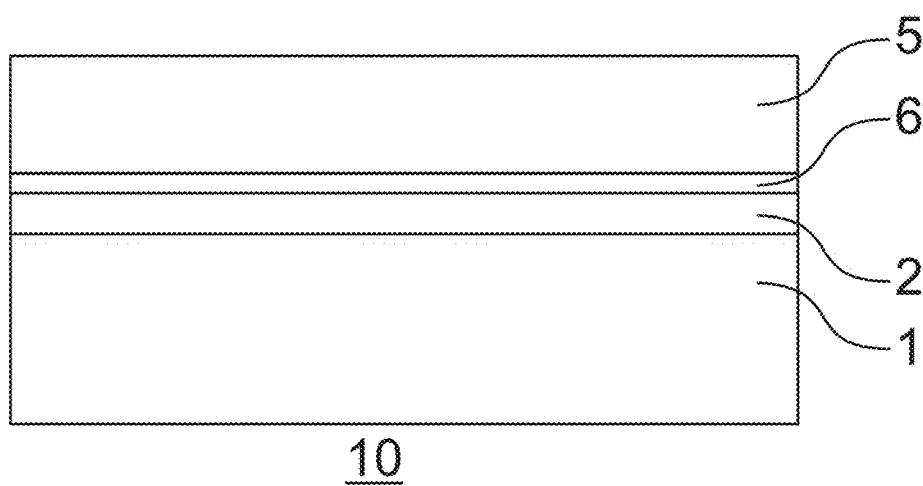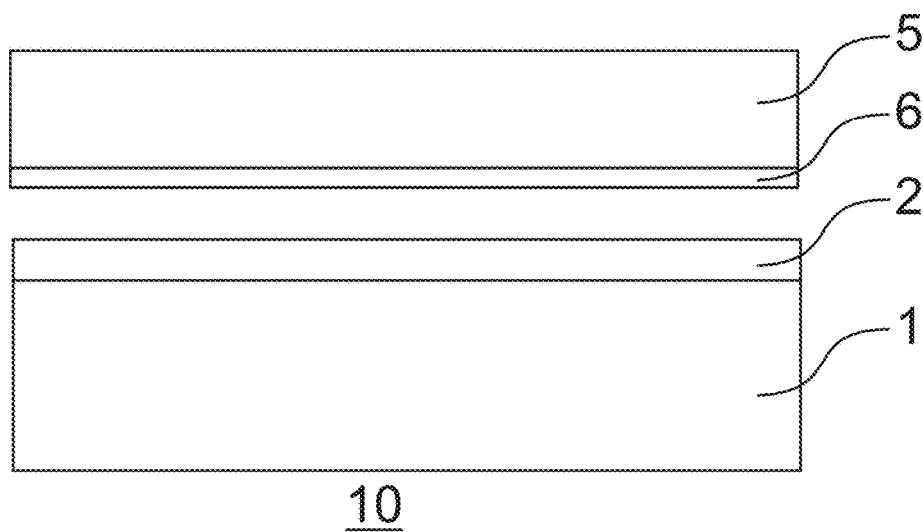

METHOD FOR MANUFACTURING A HANDLING DEVICE AND METHOD FOR REVERSIBLE BONDING USING SUCH A DEVICE

CROSS-REFERENCE TO RELATED APPLICATION

This application claims priority to French Patent Application No. 1655076 filed Jun. 3, 2016, the entire contents of which is incorporated herein by reference in its entirety.

TECHNICAL FIELD OF THE INVENTION

The technical field of the invention is that of the manufacture of semiconductor devices. The present invention relates to the manufacture of a handling device, a handling device obtained by means of said method as well as a method for reversible bonding using said handling device.

TECHNOLOGICAL BACKGROUND OF THE INVENTION

When it is wished to carry out a manufacturing step on a wafer, hereafter called wafer of interest, it is known to bond this wafer of interest on a handling device, the latter being usually composed of a support wafer comprising an adhesive layer composed of one or more layers of polymers. The wafer of interest may for example be composed of a semiconductor material such as silicon. It may notably be a thinned wafer of silicon, for example a wafer of which the thickness is less than 200 µm. The role of the handling device is to reinforce the mechanical structure of the wafer of interest in order to avoid the formation of fissures during the manufacturing step(s) following the bonding step. The adhesive layer, in addition to ensuring the adherence of the wafer of interest to the handling device, makes it possible to deal with the topology of the wafer of interest at the level of the face in contact with the handling device. The thickness of this adhesive layer is in general greater than 10 µm.

Once the manufacturing steps necessitating the use of a handling device have been carried out, the handling device and the wafer of interest are separated. However, residues derived from the polymer(s) composing the adhesive layer are found on the wafer of interest as well as on the handling device. It is thus necessary to carry out a step of cleaning of the wafer of interest as well as a step of recycling of the handling device. The recycling step is in general carried out in two stages: a sub-step of cleaning of the surface of the support wafer; and one or more sub-steps of coating so as to form a new adhesive layer on the support wafer in order to obtain a new handling device.

In order to eliminate the recycling step, a method for reversible bonding may be used, that is to say a method for bonding which, after separation, does not leave any trace of adhesive on the wafer of interest and makes it possible to use directly the handling device in a new method for bonding while thus doing away with the recycling step. However, a single adhesive layer comprising a single polymer layer cannot in a general manner be employed in a method for reversible bonding and this applies even if the adherence is low at the level of the interfaces formed between the adhesive layer and the wafer of interest or the support wafer. In fact, when the bonding is carried out by means of an adhesive layer comprising a single polymer layer, it is difficult to ensure a sufficient difference in adherence between the interfaces formed between the adhesive layer and the wafer of interest or the support wafer to be able to ensure dismantling. In order to introduce a difference in the adherence energy at the level of these interfaces, an adhesive layer comprising a stack of different polymers is thus normally used.

In order to enable the use of a handling device comprising a single adhesive layer composed of a single polymer layer in a method for reversible bonding, it has been proposed to use a first temperature for the step of coating on the support wafer of the adhesive layer comprising a single polymer layer and a second temperature for the step of bonding of the wafer of interest on the handling device. To do so, the coating of the adhesive layer is carried out at a first temperature $T_1$ and the step of bonding of the wafer of interest on the handling device is carried out at a temperature $T_2$ such that $T_1 > T_2$. In this way, the adherence energy between the adhesive layer and the support wafer is greater than between the adhesive layer and the wafer of interest. Thus, during separation, the adhesive layer remains entirely on the support wafer and no step of cleaning of the wafer of interest or recycling of the handling device is necessary. The handling device may then be directly reused and the method for bonding is thus a method for reversible bonding.

However, when the step of bonding of the handling device with the wafer of interest is carried out at not very high temperatures, typically between 100 and 160° C. or even from room temperature to 160° C., the total thickness variation (TTV) of the adhesive layer becomes important and causes a deterioration of the manufacturing steps necessitating the use of a handling device. FIG. 1 illustrates the total thickness variation of a single adhesive layer composed of the adhesive 5150 of the Brewer Company for different bonding temperatures. This curve clearly shows the increase in the total thickness variation of the single adhesive layer, and thus the reduction in quality for low bonding temperatures, notably less than 200° C.

In order to reduce the total thickness variation of the single adhesive layer while maintaining a low bonding temperature, it is known to use an adhesive composed of a polymer of which the glass transition temperature is low, which makes it possible to reduce the viscosity of the adhesive layer during bonding and thus to obtain a lower total thickness variation of this same layer for a given temperature. However, when the steps that succeed the bonding step necessitate the use of a high temperature and notably higher than the bonding temperature, the adhesive layer will be, for these temperatures, of very low viscosity. This low viscosity of the adhesive layer could bring about delaminatioris and make the use of a handling device incompatible with certain methods for manufacturing.

It will thus be understood from the preceding that, although it is possible to carry out a method for reversible bonding by means of a handling device with a single adhesive layer, it is currently very difficult to obtain a low total thickness variation for bonding temperatures typically between 100 and 160° C. or even from room temperature to 160° C. without resorting to a polymer having a low glass transition temperature and thus capable of bringing about a delamination during later steps carried out at higher temperatures.

There thus exists a need for a method making it possible to obtain a handling device with a single adhesive layer making it possible to obtain a low total thickness variation for low bonding temperatures without all the same resorting to a polymer having a low glass transition temperature.

SUMMARY OF THE INVENTION

The invention offers a solution to the aforementioned problems. To do so, the invention firstly proposes a method for manufacturing in which a first wafer comprising a single adhesive layer is brought into contact with a second wafer comprising an antiadhesive layer. This bringing into contact makes it possible to obtain a handling device comprising a single adhesive layer comprising a single polymer layer having a low total thickness variation for low bonding temperatures without all the same requiring that the polymer of the adhesive layer has a low glass transition temperature.

By definition, the term adhesive is employed in the presence of one or more polymers which make it possible when they are arranged between two surfaces to increase the adherence energy between these two surfaces compared to the energy that would exist in its absence. Conversely, an antiadhesive decreases this adherence energy.

Moreover, the handling device obtained makes it possible to implement a method for reversible bonding of a wafer of interest to a handling device according to the invention not necessitating a step of cleaning of the wafer of interest or of recycling of the handling device at the end of the separation step.

To do so, one aspect of the invention relates to a method for manufacturing a handling device comprising:
- a step of deposition of a single layer of an adhesive on a first surface of a first wafer;
- a step of deposition of an antiadhesive layer on a first surface of a second wafer different from the first wafer;
- a step of bringing into contact the first wafer and the second wafer, the bringing into contact taking place at the level of the single adhesive layer of the first wafer and the antiadhesive layer of the second wafer;
- a step of separation of the first wafer and the second wafer.

In addition, the step of bringing into contact the first wafer and the second wafer is carried out at a temperature $T_C$ such that $T_C > T_g + 100°$ C., for example, $T_C = T_g + 120°$ C., where $T_g$ is the glass transition temperature of the material composing the single adhesive layer of the first wafer. At the end of this method, the first wafer comprising the single adhesive layer forms a handling device.

Thanks to the method according to the invention, a handling device is obtained comprising a single adhesive layer having a small total thickness variation, including for low bonding temperatures of the order of 150° C., or even less. If fact, the temperature during the step of bringing into contact is chosen such that the viscosity of the adhesive is sufficient to obtain good homogeneity of the single adhesive layer and thus a low total thickness variation, of the order of 10 μm for a wafer of 300 mm diameter. "A single adhesive layer" is taken to mean an adhesive layer comprising a single layer of a polymer. Similarly, handling device is taken to mean the device comprising the first wafer and the single adhesive layer. Moreover, "the step of bringing into contact the first wafer and the second wafer is carried out at a temperature $T_C$" is taken to mean that when the first wafer enters into contact with the second wafer, the temperature of said wafers is equal to $T_c$.

Apart from the characteristics that have been mentioned in the preceding paragraph, the method for manufacturing a handling device according to one aspect of the invention may have one or more of the additional characteristics among the following, considered individually or according to any possible technical combinations thereof.

Advantageously, the step of deposition of the single layer of an adhesive comprises after an actual step of deposition a step of annealing of the first wafer. This annealing makes it possible to eliminate, if needs be, solvent from the single adhesive layer and reinforces the adherence between the wafer and the adhesive.

Advantageously, the temperature $T_c$ during the step of bringing into contact is greater than 160° C., preferably greater than 200° C.

Preferably, the antiadhesive composing the antiadhesive layer of the second wafer is chosen such that the adherence energy between said antiadhesive layer and the adhesive is less than 1 J·m$^{-2}$ at the temperature at which the step of bringing into contact the first wafer and the second wafer is carried out. This energy is much less than the adherence generally obtained between a wafer and an adhesive that often exceeds 4 J·m$^{-2}$ for identical bonding temperatures.

The adherence values provided in this document are conventionally measured by the double cantilever beam test, also known as wedge insertion adherence measurement. Reference may be made to the article S. M. WIEDERHORN et al, JOURNAL OF APPLIED PHYSICS VOLUME 39, NUMBER 3, 15 Feb. 1968 for more details on this technique.

Thus, the separation between the first wafer and the second wafer is facilitated while guaranteeing good homogeneity of the single adhesive layer.

A second aspect of the invention relates to a method for reversible bonding comprising a step of bringing into contact a handling device according to one aspect of the invention with a third wafer, said wafer of interest, the bringing into contact of said handling device with said wafer of interest taking place at the level of the surface comprising the single adhesive layer.

Thus, additional steps of the method may be applied to the wafer of interest without risk of damaging the latter. Moreover, the thickness of the single adhesive layer makes it possible to deal with in an efficient manner the topology of the wafer of interest at the level of the surface on which the bringing into contact is carried out, including when the temperature during the step of bringing into contact is low, typically less than 160° C., for example between 100 and 160° C. or even from room temperature to 160° C.

In addition, the adherence energy between the single adhesive layer and the wafer of interest is lower than the adherence energy between the single adhesive layer and the wafer of the handling device. After separation, the wafer of interest thus does not have any trace of adhesive and no cleaning step is necessary. The single adhesive layer of the handling device further conserves a low total thickness variation and is thus directly reusable for another method for reversible bonding.

Apart from the characteristics mentioned in the preceding paragraph, the method for reversible bonding according to one aspect of the invention may have one or more additional characteristics among the following, considered individually or according to any technically possible combinations thereof.

Advantageously, the step of bringing into contact the handling device with the wafer of interest is carried out at a temperature $T_{CW}$ such that $T_g < T_{CW} < T_g + 50°$ C., where $T_g$ is the glass transition temperature of the material composing the single adhesive layer of the handling device.

Advantageously, the temperature $T_{CW}$ during the step of bringing into contact the handling device with the wafer of interest is less than 160° C.

The difference in the two methods for bringing into contact means that the adherence between the single adhesive layer and the wafer of interest is lower than the adherence between the single layer and the handling wafer. This makes it possible to facilitate the separation step.

Advantageously, the step of bringing into contact is preceded by a step of deposition of an antiadhesive layer on a first surface of the wafer of interest; the bringing into contact during the step of bringing into contact taking place at the level of the single adhesive layer of the handling device and the antiadhesive layer of the wafer of interest.

Thus, the adherence energy may be modulated by the choice of the antiadhesive and the strains imposed during the separation step are adapted as a function of the nature and the fragility of the wafer of interest.

The invention and the different applications thereof will be better understood on reading the description that follows and by examining the figures that accompany it.

BRIEF DESCRIPTION OF THE FIGURES

The figures are presented for indicative purposes and in no way limit the invention.

FIGS. 8A to 8C illustrate the different steps of a method for reversible bonding according to a fourth embodiment of the invention.

DETAILED DESCRIPTION OF AT LEAST ONE EMBODIMENT OF THE INVENTION

Figure 1:
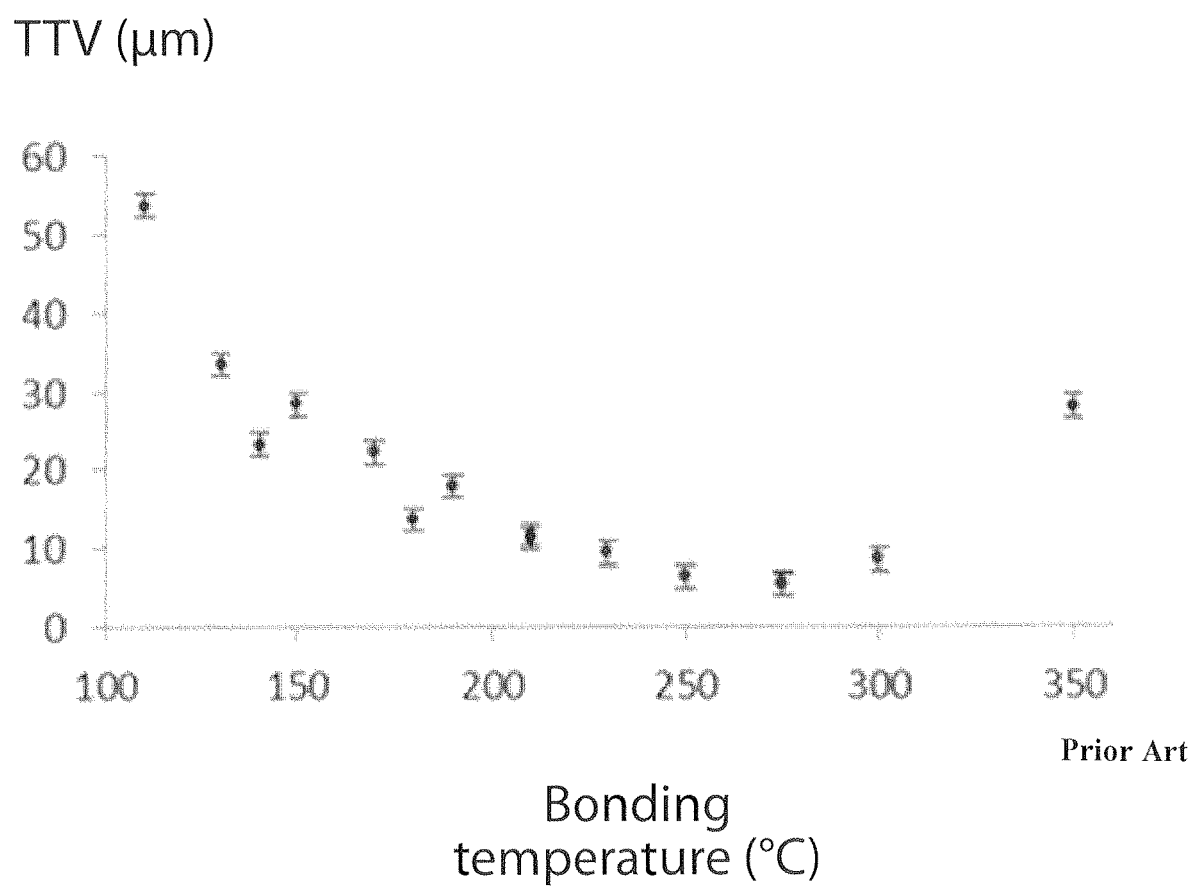
FIG. 1 shows a curve representing the total thickness variation (TTV) for different bonding temperatures in the case of a method according to the prior art.
Figure 2:
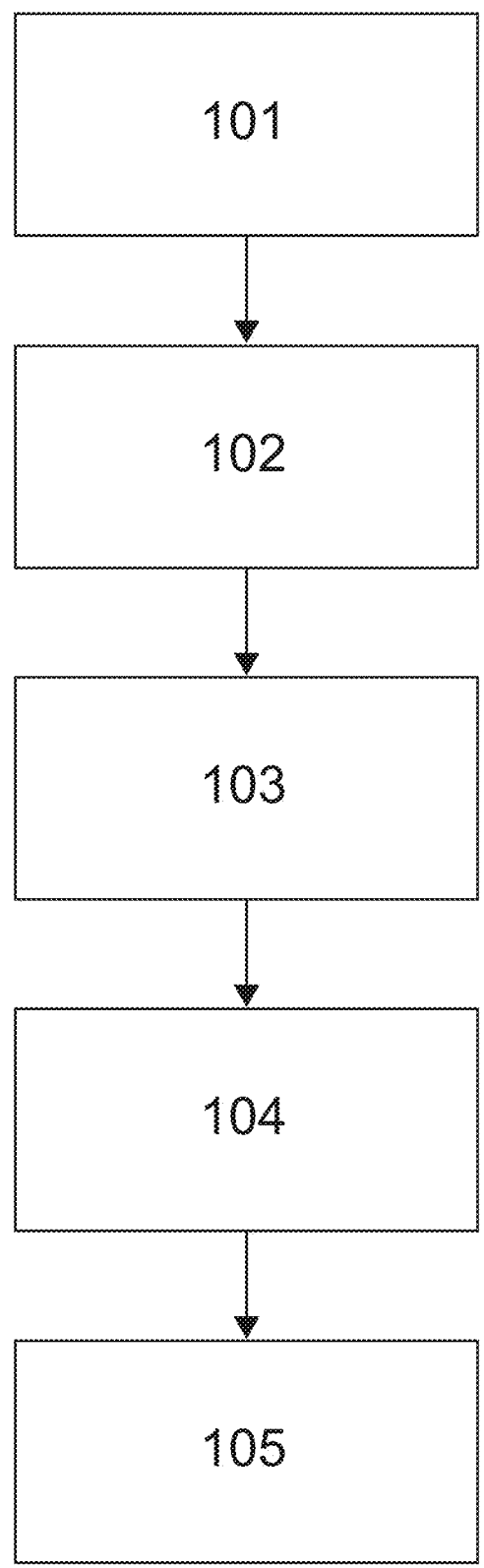
FIG. 2 shows a flowchart of a method for manufacturing a handling device according to a first embodiment of the invention.

Unless stated otherwise, a same element appearing in the different figures has a single reference.

As illustrated in FIG. 2 and FIGS. 3A to 3E, a first aspect of the invention relates to a method for manufacturing a handling device 10. In one embodiment, the method according to the invention comprises:
a step of deposition 101 (FIG. 2A) of a single adhesive layer 2 comprising a solvent on a first surface of a first wafer 1;
a step of annealing 102 of the first wafer 1 so as to eliminate solvent from the single adhesive layer 2;
a step of deposition 103 (FIG. 2B) of an antiadhesive layer 4 on a first surface of a second wafer 3 different from the first wafer 1;
a step of bringing into contact 104 (FIG. 2C) the first wafer 1 and the second wafer 3, the bringing into contact taking place by the single adhesive layer 2 of the first wafer 1 and the antiadhesive layer 4 of the second wafer 3;
a step of separation 105 (FIG. 2D) of the first wafer 1 and the second wafer 3.

In one embodiment, the step of separation 105 takes place immediately after the step 104 of bringing into contact, that is to say without any technological step (lithography, chemical mechanical polishing, etc.) taking place between the step 104 of bringing into contact and the step of separation 105.

Figure 3A:
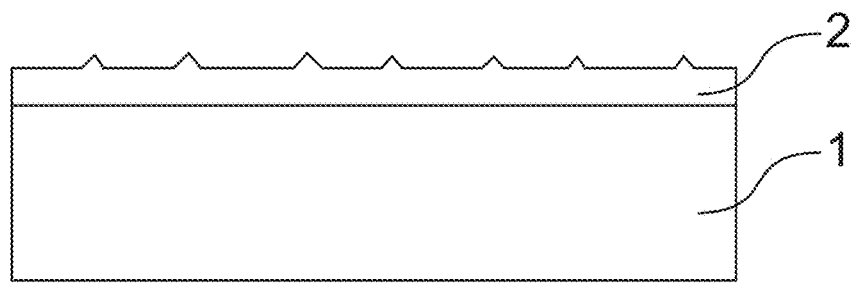
FIGS. 3A to 3E illustrate the different steps of a method for manufacturing a handling device according to a second embodiment of the invention.
Figure 3B:
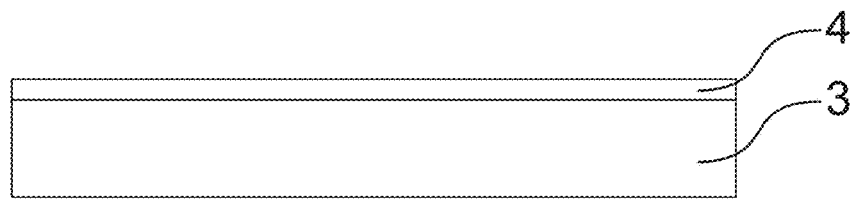
Figure 3C:
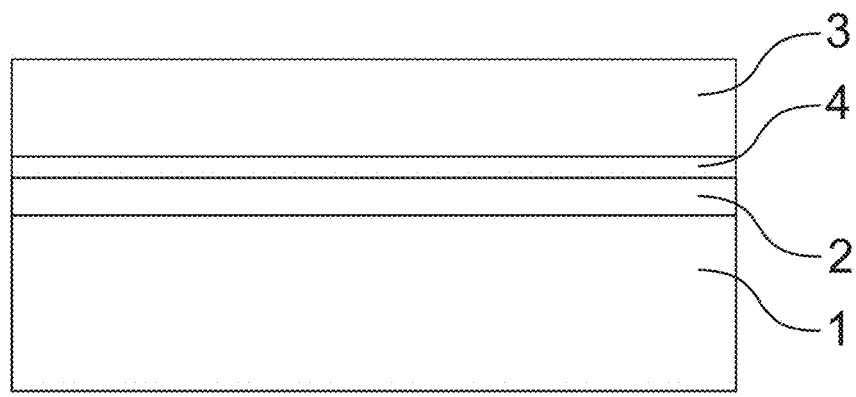
Figure 3D:
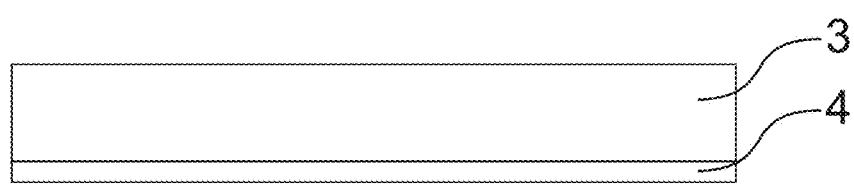
Figure 4:
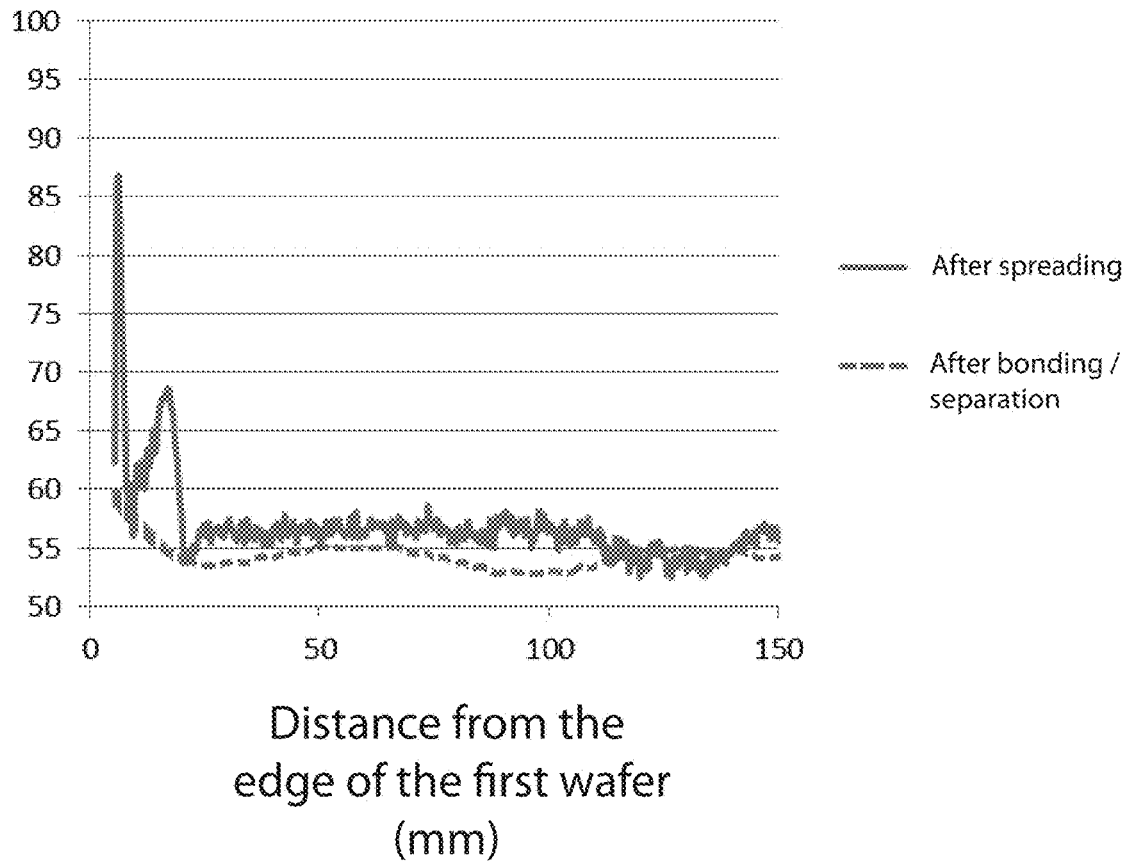
FIG. 4 shows a curve representing the thickness of the single adhesive layer as a function of the distance from the edge of the first wafer in a third embodiment of the invention.

In one embodiment, the step of deposition 101 of the single adhesive layer 2 is carried out by a spin coating technique and the thickness of the single adhesive layer 2 is comprised between 45 µm and 65 µm, for example equal to 55 µm. The material used to produce the single adhesive layer 2 may be a glue of BSI5150 type sold by the Brewer company, which has a glass transition temperature comprised between 80 and 100° C. and makes it possible to obtain an adherence energy between said glue and the first wafer greater than 5 J·m$^{-2}$. The step of annealing 102 is then carried out at a temperature of 220° C. This step of annealing 102 notably makes it possible to evaporate solvent from the single adhesive layer 2. As illustrated in FIG. 3A and in FIG. 4 ("after spreading" curve), the surface of the adhesive layer then has a high total thickness variation of the order of 35 µm.

In one embodiment, the step of deposition 103 of an antiadhesive layer 4 on a first surface of a second wafer 3 is carried out by spin coating and the thickness of the antiadhesive layer 4 is of the order of 50 nm. The material used to produce the antiadhesive layer 4 may be a fluorinated polymer of Novec 2702 type sold by the 3M Company.

Figure 3E:
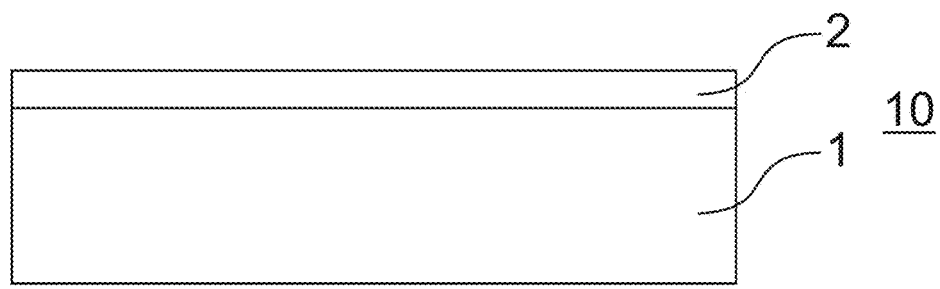

In one embodiment, the step of bringing into contact 104 is carried out at a temperature of 210° C. At the end of this step of bringing into contact 104, the first wafer 1 is separated from the second wafer 3. As illustrated in FIG. 3E and in FIG. 4 ("after bonding/separation" curve), at the end of this step of separation 105, the first wafer 1 then has a single adhesive layer 2 of which the total thickness variation is low (7 µm) and much better than that obtained directly after its spreading (35 µm). The first wafer 1 comprising an adhesive layer 2 thereby obtained then forms a handling device 10.

The handling device 10 obtained by means of a method for manufacturing according to a first aspect of the invention may next be implemented in a method for reversible bonding.

Figure 5:
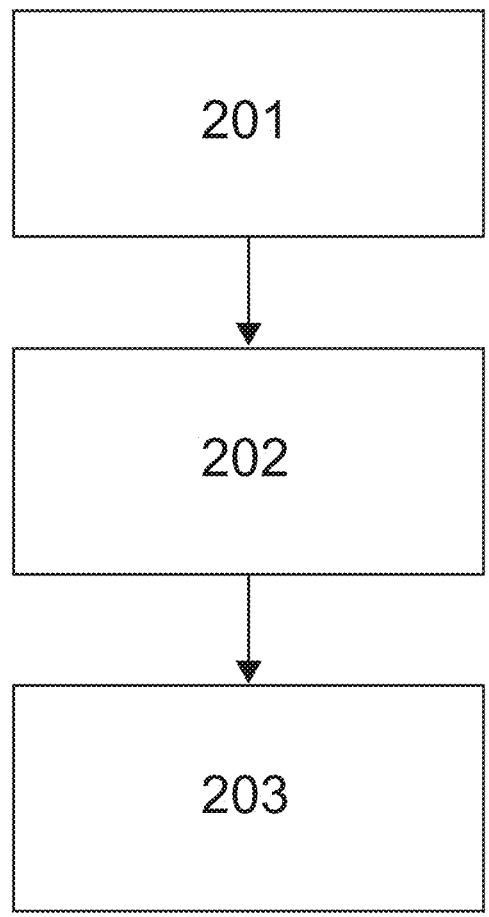
FIG. 5 shows a flowchart of a method for reversible bonding according to a first embodiment of the invention.
Figure 6A:
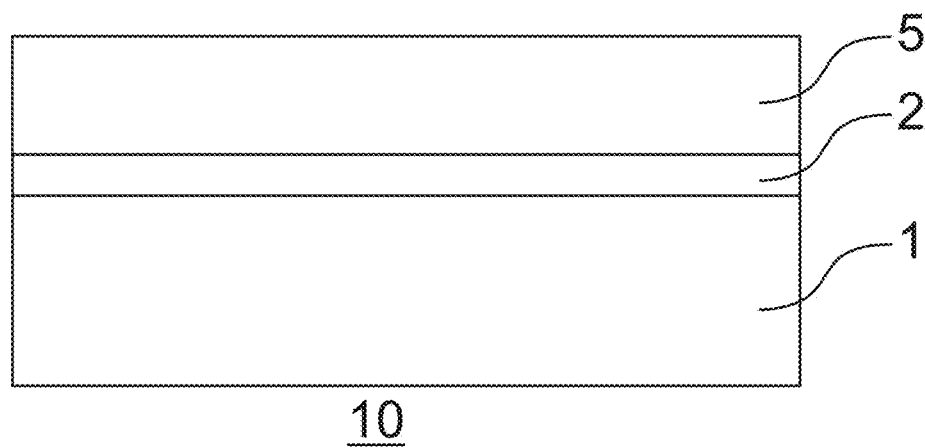
FIGS. 6A and 6B illustrated the different steps of a method for reversible bonding according to a second embodiment of the invention.
Figure 6B:
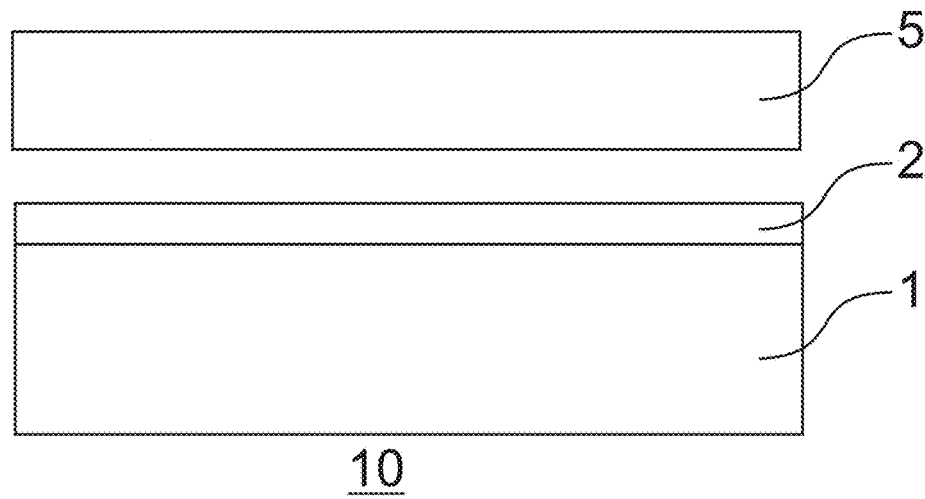
Figure 7:
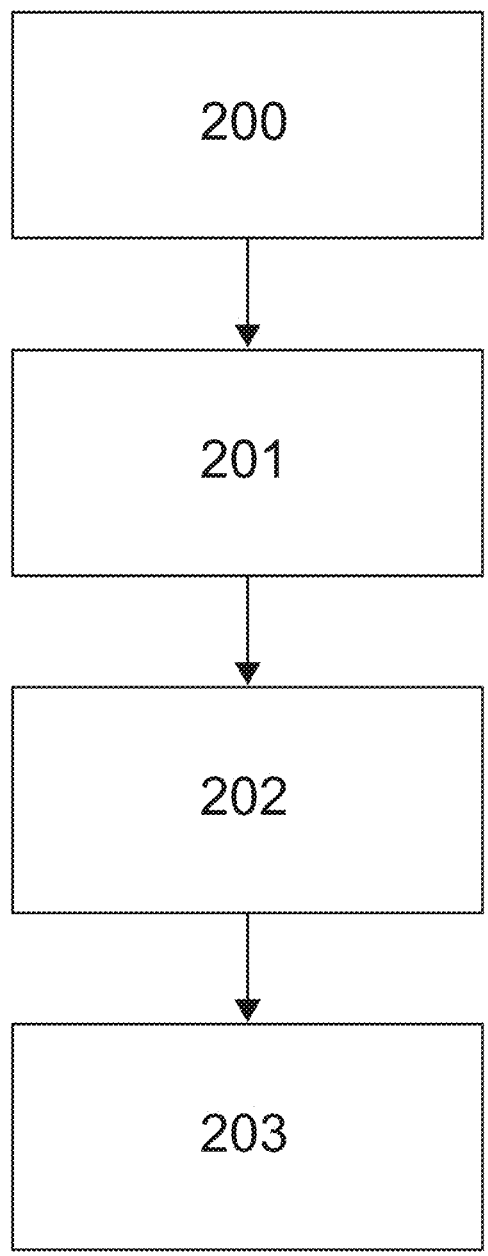
FIG. 7 shows a flowchart of a method for reversible bonding according to a third embodiment of the invention.

As illustrated in FIG. 5 and FIGS. 6A and 6B, a second aspect of the invention relates to a method for reversible bonding implementing the handling device 10 obtained by a method according to a first aspect of the invention. Such a method for bonding is used when it is wished to carry out one or more manufacturing steps on a wafer of interest 5, for example a thinned wafer, and when this or these manufacturing steps necessitate a handling device 10 in order to prevent any damage at the level of the wafer of interest 5. As illustrated in FIG. 6A, in the method for reversible bonding according to the invention, a wafer of interest 5 is brought into contact with the handling device 10 at the level of the surface comprising the single adhesive layer 2.

In one embodiment, this step of bringing into contact 201 is carried out at a temperature of 150° C. In this configuration, the total thickness variation of the adhesive layer 2 is substantially equal to 7 µm for a thickness of the single adhesive layer 2 substantially equal to 55 µm. This TTV is much better than that that would have been obtained by means of a bringing into contact at 150° C. (without use of the handling device 10): 30 µm. Once the wafer of interest 5 is in place on the handling device 10, the latter may undergo new manufacturing steps 202.

In one embodiment, the manufacturing steps 202 following the reversible bonding step comprise a thinning step and a cutting out step. To do so, the wafer of interest 5 is thinned by means of a grinding technique until reaching a thickness of 80 µm then is cut out by means of a saw over a width of 1.5 mm. As illustrated in FIG. 6B, the wafer of interest 5 thereby obtained is next separated mechanically from the handling device 10 by traction in order to obtain a thin film of silicon without flaking or fissuring. The step of mechanical separation 203 is carried out at the level of the single adhesive layer/wafer of interest interface. In this embodiment, the adherence energy at the single adhesive layer/wafer of interest interface is substantially equal to 0.9 J·m$^{-2}$. At the end of the step of separation 203, the wafer of interest 5 has a surface of which the total thickness variation is 7 μm and does not comprise any trace of polymer. The totality of the single layer adhesive 2 is thus still present on the handling device 10 and the latter may thus be reused directly. Moreover, the wafer of interest 5 does not necessitate a step of cleaning, no residue of adhesive being found on the surface thereof. The handling device 10 may thus be used immediately in a new method for reversible bonding.

In an alternative embodiment, the step of bringing into contact 201 is carried out at a temperature of 110° C. In this configuration also, the total thickness variation of the single adhesive layer 2 is substantially equal to 7 μm for a thickness substantially equal to 55 μm. However, the adherence energy at the single adhesive layer/wafer of interest interface becomes only 0.5 J·m$^{-2}$. This embodiment makes it possible to facilitate separation between the handling device 10 and the wafer of interest 5 during the step of separation 203.

If the mechanical strains during the manufacturing steps 202 carried out on the wafer of interest 5 are high, it is preferable to choose a high adherence energy to the detriment of separation facility. It is however preferable to maintain the temperature of bringing into contact 201 the wafer of interest 5 with the handling device 10 below the temperature used during the method for manufacturing said handling device 10 during the step of bringing into contact 104 the single adhesive layer 2 with the antiadhesive layer 4.

In another embodiment illustrated in FIG. 7 and FIGS. 8A to 8C, the step of bringing into contact 201 is preceded by a step of deposition 200 (FIG. 8A) of an antiadhesive layer 6 on a first surface of the wafer of interest 5. In this embodiment, the bringing into contact 201 (FIG. 8B) thus takes place at the level of the single adhesive layer 2 of the handling device 10 and of the antiadhesive layer 6 of the wafer of interest 5.

By using an antiadhesive layer in the method for bonding according to one embodiment of the invention, the temperature during the step of bringing into contact 201 of the wafer of interest 5 with the handling device 10 may be less than the temperature used during the method for manufacturing said handling device 10 during the step of bringing into contact 104 the single adhesive layer 2 with the antiadhesive layer 4.

In one embodiment, the step of deposition 200 of the antiadhesive layer 6 on a first surface of the wafer of interest 5 is carried out by spin coating and the thickness of the antiadhesive layer 6 is 50 nm. The material used to produce the antiadhesive layer 6 may be a fluorinated polymer of Novec 2702 type sold by the 3M Company. The adherence energy between the single adhesive layer 2 of the handling device 10 and the antiadhesive layer 6 of the wafer of interest 5 is 0.4 J·m$^{-2}$, which facilitates the separation of the wafer of interest 5 and the handling device 10.

The wafer of interest 5 may next undergo one or more manufacturing steps 202 as evoked previously. Once this or these manufacturing steps 202 have been carried out, the wafer of interest 5 and the handling device 10 are separated (FIG. 8C). In this embodiment also, the totality of the single adhesive layer 2 is still present on the handling device 10 at the end of the step of separation 203 and the latter may thus be reused directly. At the end of separation, the antiadhesive layer 6 is removed from the wafer of interest 5. This removal may for example be carried out by means of an oxygen plasma treatment at 80° C.

The invention claimed is:

1. A method for reversible bonding, the method comprising:
   producing a handling device by performing
      a step of deposition of a single layer of an adhesive on a first surface of a first wafer;
      a step of deposition of an antiadhesive layer on a first surface of a second wafer different from the first wafer;
      a step of bringing into contact the first wafer and the second wafer, the bringing into contact taking place at a level of the single adhesive layer of the first wafer and the antiadhesive layer of the second wafer;
      a step of separation of the first wafer and the second wafer so as to leave the single adhesive layer on the first wafer;
      the first wafer comprising the single adhesive layer forming the handling device, wherein the step of bringing into contact the first wafer and the second wafer is carried out at a temperature $T_C$ such that $T_C > T_g + 100°$ C. where $T_g$ is a glass transition temperature of a material composing the single adhesive layer of the first wafer, and
   bringing into contact said handling device with a third wafer, the bringing into contact of said handling device with said third wafer taking place at a level of the surface comprising the single adhesive layer,
   wherein the step of bringing into contact the handling device with the third wafer is carried out at a temperature $T_{CW}$ such that $T_g < T_{CW} < T_g + 50°$ C. where $T_g$ is the glass transition temperature of the material composing the single adhesive layer of the handling device.

2. The method according to claim 1, wherein the temperature $T_c$ during the step of bringing into contact the first wafer and the second wafer is greater than 160° C.

3. The method according to claim 1, wherein an antiadhesive composing the antiadhesive layer of the second wafer is chosen such that the adherence energy of said antiadhesive layer is less than 1 J·m$^{-2}$ at a temperature at which the step of bringing into contact the first wafer and the second wafer is carried out.

4. The method according to claim 1, wherein the temperature $T_{CW}$ during the step of bringing into contact the handling device with the third wafer is less than 160° C.

5. The method for bonding according to claim 1, wherein the step of bringing into contact the handling device with the third wafer is preceded by a step of deposition of an antiadhesive layer on a first surface of the third wafer; the bringing into contact during the step of bringing into contact taking place at a level of the single adhesive layer of the handling device and the antiadhesive layer of the third wafer.

6. The method according to claim 2, wherein the temperature $T_c$ during the step of bringing into contact is greater than 200° C.

* * * * *